US009449851B2

(12) United States Patent
Wong et al.

(10) Patent No.: US 9,449,851 B2
(45) Date of Patent: Sep. 20, 2016

(54) LOCAL DOPING OF TWO-DIMENSIONAL MATERIALS

(71) Applicants: Dillon Wong, Alameda, CA (US); Jairo Velasco, Jr., Berkeley, CA (US); Long Ju, Berkeley, CA (US); Salman Kahn, Tracy, CA (US); Juwon Lee, Berkeley, CA (US); Chad E. Germany, Richmond, CA (US); Alexander K. Zettl, Kensington, CA (US); Feng Wang, Fremont, CA (US); Michael F. Crommie, Oakland, CA (US)

(72) Inventors: Dillon Wong, Alameda, CA (US); Jairo Velasco, Jr., Berkeley, CA (US); Long Ju, Berkeley, CA (US); Salman Kahn, Tracy, CA (US); Juwon Lee, Berkeley, CA (US); Chad E. Germany, Richmond, CA (US); Alexander K. Zettl, Kensington, CA (US); Feng Wang, Fremont, CA (US); Michael F. Crommie, Oakland, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 14/833,407

(22) Filed: Aug. 24, 2015

(65) Prior Publication Data

US 2016/0064249 A1 Mar. 3, 2016

Related U.S. Application Data

(60) Provisional application No. 62/043,672, filed on Aug. 29, 2014.

(51) Int. Cl.
*H01L 21/20* (2006.01)
*H01L 21/326* (2006.01)
(Continued)

(52) U.S. Cl.
CPC ......... *H01L 21/326* (2013.01); *H01L 21/2254* (2013.01); *H01L 21/2256* (2013.01); *H01L 21/479* (2013.01); *H01L 29/1606* (2013.01); *H01L 21/02381* (2013.01);
(Continued)

(58) Field of Classification Search
CPC .................. H01L 21/02502; H01L 21/02527; H01L 21/326; H01L 21/479
See application file for complete search history.

(56) References Cited

U.S. PATENT DOCUMENTS

| 2014/0134409 A1* | 5/2014 | Odagawa | ................ C01B 31/02 428/201 |
| 2014/0233297 A1* | 8/2014 | Ozyilmaz | .............. B82Y 10/00 365/145 |

(Continued)

OTHER PUBLICATIONS

Tamara Monti et al., "Near Field Microwave Microscopy for Nanoscale Characterization, Imaging and Patterning of Graphene", Internation Conference on Manipulation, Manufacturing and Measurement on the Nanoscale, Oct. 2014.*

(Continued)

*Primary Examiner* — John C Ingham
*Assistant Examiner* — Frederick B Hargrove
(74) *Attorney, Agent, or Firm* — Lawrence Berkeley National Laboratory

(57) ABSTRACT

This disclosure provides systems, methods, and apparatus related to locally doping two-dimensional (2D) materials. In one aspect, an assembly including a substrate, a first insulator disposed on the substrate, a second insulator disposed on the first insulator, and a 2D material disposed on the second insulator is formed. A first voltage is applied between the 2D material and the substrate. With the first voltage applied between the 2D material and the substrate, a second voltage is applied between the 2D material and a probe positioned proximate the 2D material. The second voltage between the 2D material and the probe is removed. The first voltage between the 2D material and the substrate is removed. A portion of the 2D material proximate the probe when the second voltage was applied has a different electron density compared to a remainder of the 2D material.

18 Claims, 3 Drawing Sheets

(51) Int. Cl.
   *H01L 21/479*   (2006.01)
   *H01L 21/225*   (2006.01)
   *H01L 29/16*    (2006.01)
   *H01L 21/02*    (2006.01)

(52) U.S. Cl.
   CPC .. *H01L 21/02488* (2013.01); *H01L 21/02502* (2013.01); *H01L 21/02527* (2013.01); *H01L 21/02568* (2013.01)

(56) References Cited

U.S. PATENT DOCUMENTS

2014/0264282 A1*  9/2014  Lee ................ H01L 29/267 257/29
2014/0366229 A1* 12/2014  Kim ................ G01Q 60/10 850/21

OTHER PUBLICATIONS

L. Ju et al., "Photoinduced doping in heterostructures of graphene and boron nitride," Nature Nanotechnology, vol. 9 , May 2014.
M.S. Choi et al., "Controlled charge trapping by molybdenum disulphide and graphene in ultrathin heterostructured memory devices," Nature Communications, 4:1624, 2013.
C. R. Dean et al., "Boron nitride substrates for high-quality graphene electronics," Nature Nano 5, 722-726 (2010).
P. J. Zomer et al., "A transfer technique for high mobility graphene devices on commercially available hexagonal boron nitride," Appl. Phys. Lett. 99, 232104 (2011).
Y. D. Kim et al., "Focused-laser-enabled p-n junctions in graphene field-effect transistors," ACS Nano 7, 5850-5857 (2013).
A. Tiberj et al., "Reversible optical doping of graphene," Sci. Rep. 3, 2355 (2013).

* cited by examiner

LOCAL DOPING OF TWO-DIMENSIONAL MATERIALS

RELATED APPLICATIONS

This application claims priority to U.S. Provisional Patent Application No. 62/043,672, filed Aug. 29, 2014, which is herein incorporate by reference.

STATEMENT OF GOVERNMENT SUPPORT

This invention was made with government support under Contract No. DE-AC02-05CH11231 awarded by the U.S. Department of Energy, under Contract No. NSF-CMMI-1235361 awarded by the National Science Foundation, and under a National Defense Science and Engineering Graduate Fellowship awarded by the U.S. Department of Defense. The government has certain rights in this invention.

TECHNICAL FIELD

This disclosure relates generally to two-dimensional (2D) materials, and more particularly to local doping of 2D materials.

BACKGROUND

Two-dimensional (2D) materials have become promising candidates for integration into electronic and optoelectronic devices. As the sizes of electronic devices shrink, it becomes increasingly important to control the charge density of materials on smaller length scales, including the charge density in 2D materials.

SUMMARY

Described herein is a method for locally doping two-dimensional (2D) materials. For example, a 2D material (e.g., graphene) can be disposed on an insulator (e.g., boron nitride). The insulator can be disposed on another insulator with a wider energy gap (e.g., $SiO_2$). The wider energy gap insulator can be disposed on a back-gate (e.g., silicon). After a conductor (e.g., a metal wire, a carbon nanotube, or an electrode) is brought within about 10 nanometers of the 2D material, a voltage (e.g., about –3V or lower) can be applied to the conductor to change the number of electrons in the 2D material in an area proximate the conductor. The change in the electron density depends on the sign and magnitude of an applied back-gate voltage. This local doping can persist in the material after the conductor is removed. Embodiments of the methods allow for spatial control of the electron density on a 2D material in a van der Waals heterostructure geometry. The local doping also can be altered (and even removed) by the subsequent application of the voltage to the conductor. This allows for the patterning of spatially varying doping configurations in 2D materials.

One innovative aspect of the subject matter described in this disclosure can be implemented in a method including: (a) forming an assembly including a substrate, a first insulator disposed on the substrate, a second insulator disposed on the first insulator, and a two-dimensional (2D) material disposed on the second insulator; (b) applying a first voltage between the 2D material and the substrate; (c) with the first voltage applied between the 2D material and the substrate, applying a second voltage between the 2D material and a probe positioned proximate the 2D material; (d) removing the second voltage between the 2D material and the probe; and (e) removing the first voltage between the 2D material and the substrate, a portion of the 2D material proximate the probe in operation (c) having a different electron density compared to a remainder of the 2D material.

Details of one or more embodiments of the subject matter described in this specification are set forth in the accompanying drawings and the description below. Other features, aspects, and advantages will become apparent from the description, the drawings, and the claims. Note that the relative dimensions of the following figures may not be drawn to scale.

DETAILED DESCRIPTION

Reference will now be made in detail to some specific examples of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

In the following description, numerous specific details are set forth in order to provide a thorough understanding of the present invention. Particular example embodiments of the present invention may be implemented without some or all of these specific details. In other instances, well known process operations have not been described in detail in order not to unnecessarily obscure the present invention.

Various techniques and mechanisms of the present invention will sometimes be described in singular form for clarity. However, it should be noted that some embodiments include multiple iterations of a technique or multiple instantiations of a mechanism unless noted otherwise.

Method

A process for controlling the charge density of two-dimensional (2D) materials (e.g., graphene and molybdenum disulfide ($MoS_2$)) with nanometer precision is described herein. Embodiments of the methods described herein could potentially be exploited to pattern p-n junctions and transistors, encode and store information, and in touch screens.

Figure 1:
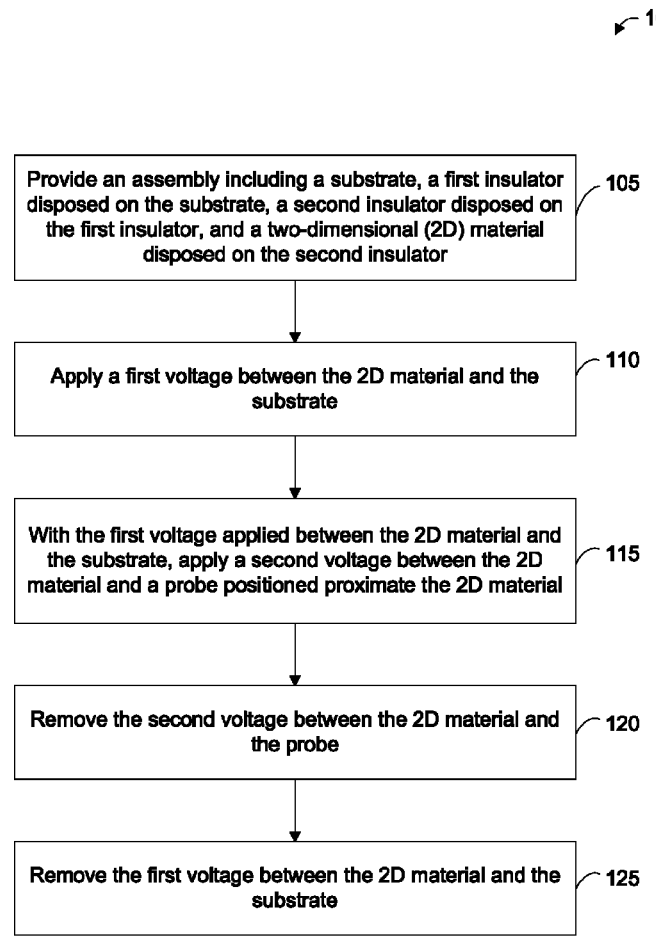
FIG. 1 shows an example of a flow diagram illustrating a method for locally doping a 2D material.

FIG. 1 shows an example of a flow diagram illustrating a method for locally doping a 2D material. Starting at block 105 of the method 100, an assembly including a substrate, a first insulator disposed on the substrate, a second insulator disposed on the first insulator, and a two-dimensional (2D) material disposed on the second insulator is provided. A 2D material is generally considered to be a material that occupies a plane (e.g., an x and a y direction) and is about 1 atom to 10 atoms thick (e.g., in the z direction).

Graphene is one example of a 2D material. Graphene can exist as a monolayer (e.g., a single atomic layer) of carbon.

Graphene can also exist as multiple monolayers (e.g., about 10 monolayers or less). For example, graphene may have a thickness of about 0.354 nanometers (nm) to 3 nm.

In some embodiments, the 2D material comprises a monolayer of a material. In some embodiments, the 2D material comprises about 10 monolayers of a material or less. In some embodiments, the 2D material comprises graphene. In some embodiments, the 2D material comprises a 2D chalcogenide. In some embodiments, the 2D material is selected from a group consisting of molybdenum disulfide ($MoS_2$), molybdenum diselenide ($MoSe_2$), tungsten disulfide ($WS_2$), and tungsten diselenide ($WSe_2$). Other 2D materials may also be used, including, for example, layered superconductors, semiconducting dichalcogenides, metallic dichalcogenides, and layered semiconductors. Graphene or other 2D materials can be fabricated and then transferred to the second insulator using methods known by a person having ordinary skill in the art.

In some embodiments, the first insulator has a greater band gap than the second insulator. For example, in some embodiments, the first insulator comprises silicon oxide ($SiO_2$) and the second insulator comprises boron nitride. In some embodiments, the first insulator comprises a material selected from a group consisting of silicon oxide, hafnium oxide ($HfO_2$), and aluminum oxide ($Al_2O_3$). In some embodiments, the first insulator comprises a polymer (e.g., polyethylene terephthalate, polyether ether ketone, polyimide, polyethylene, polytetrafluoroethylene, or polydimethylsiloxane) or a plastic. In some embodiments, the second insulator comprises a material selected from a group consisting of a 2D oxide, boron nitride (e.g., hexagonal boron nitride), and a silicate mineral (e.g., mica). In some embodiments, the first insulator is about 10 nm to 500 nm thick, or about 300 nm thick. In some embodiments, the second insulator is about 5 nm to 300 nm thick, or about 100 nm thick.

In some embodiments, the substrate comprises a conductive material. For example, in some embodiments, the substrate comprises a material selected from a group consisting of a doped semiconductor (e.g., highly doped silicon), a layered semimetal (e.g., graphite), and a metal. In some embodiments, the substrate is about 50 nm thick or greater, about 50 nm to 950 microns thick, about 250 microns to 750 microns thick, or about 500 microns thick.

At block 110, a first voltage (e.g., a voltage bias, $V_{substrate}$) is applied between the 2D material and the substrate. In some embodiments, the first voltage applied between the 2D material and the substrate is about −150 volts to +150 volts, about −60 volts to +60 volts, or about −30 volts to +30 volts. In some embodiments, the quality of the first insulator determines in part the magnitude of the first voltage that can be applied between the 2D material and the substrate. For example, with a high quality first insulator, a high voltage may be able to be applied between the 2D material and the substrate. A high quality insulator is an insulator that has a high electrical breakdown voltage. An insulator may be a high quality insulator if it has no or few pinholes and/or defects.

In some embodiments, the dielectric constant of the first insulator determines in part the local doping of the 2D material. For example, local doping of a 2D material using a first insulator with a high dielectric constant and applying a small first voltage ($V_{substrate}$) may enable the same level of local doping of the 2D material as using a first insulator with a lower dielectric constant and applying a larger first voltage ($V_{substrate}$). As another example, local doping of a 2D material using a first insulator with a high dielectric constant and applying a first voltage ($V_{substrate}$) may enable a higher level of local doping of the 2D material compared to using a first insulator with a lower dielectric constant and applying the same first voltage ($V_{substrate}$).

The first voltage may be applied with a voltage source capable of generating a specific voltage. In some embodiments, the greater the magnitude of the first voltage, the greater the magnitude of local doping in the 2D material.

At block 115, with the first voltage applied between the 2D material and the substrate, a second voltage (e.g., a voltage bias, $V_{probe}$) is applied between the 2D material and a probe e, positioned proximate the 2D material. In some embodiments, the probe is positioned about 10 nm or less from the 2D material or about 5 nm or less from the 2D material. For example, the probe may be positioned about 0.5 nm to 2 nm from the 2D material. In some embodiments, the second voltage applied between the probe and the 2D material is about −100 volts to +100 volts or about −10 volts to +10 volts. For example, in some embodiments, the second voltage applied between the probe and the 2D material is about +5 volts or higher (e.g., about +5 volts to +10 volts). In some embodiments, the second voltage applied between the probe and the 2D material is about −3 volts or lower (e.g., about −3 volts to −10 volts). The second voltage may be applied with a voltage source capable of generating a specific voltage.

In some embodiments, the probe comprises a conductive material. For example, in some embodiments, the probe comprises a metal (e.g., a platinum iridium alloy, gold, chromium, copper, silver, or titanium) wire or a carbon nanotube. A cross-sectional area or dimension (e.g., diameter, when the probe has a circular cross section) will determine, in part, the regions of the 2D material that will be locally doped. For example, regions of the 2D material that are about 10 nm in size or about 1 nm in size can be locally doped when a probe having nanometer-sized cross-sectional dimensions is used at block 115.

In some embodiments, the probe comprises a conductive substrate and a pattern disposed on a surface the conductive substrate comprising a conductive material. For example, the pattern disposed on the surface of the conductive substrate may be a raised relief pattern, such as that formed in an embossing process. In some embodiments, the raised pattern is positioned about 10 nm or less from the 2D material, about 5 nm or less from the 2D material, or about 0.5 nm to 2 nm from the 2D material. Semiconductor fabrication techniques (e.g., nanolithography techniques) could be used to create a specific pattern on the surface of a conductive substrate. The pattern on the conductive substrate will determine, in part, the regions of the 2D material that are locally doped. For example, the pattern may include parallel lines, circular projections, or other shapes and lines.

As another example, in some embodiments, the probe comprises a conductive substrate and a plurality of nanotubes (e.g., conductive nanotubes, such as carbon nanotubes or metallic nanotubes) disposed on a surface of the substrate, with the nanotube being arranged in a specific pattern. In this example, the nanotubes may be disposed on the surface of the substrate such that the axes of the nanotubes are substantially perpendicular to the surface of the substrate. In some embodiments, the nanotubes are positioned about 10 nm or less from the 2D material, about 5 nm or less from the 2D material, or about 0.5 nm to 2 nm from the 2D material. The pattern of the nanotubes disposed on the substrate will determine, in part, the regions of the 2D material that are locally doped.

At block 120, the second voltage between the 2D material and the probe is removed. In some embodiments, the second voltage applied between the 2D material and the probe is applied for about 0.1 seconds to 5 minutes, or about 0.1 seconds to 10 seconds. In some embodiments, the greater the spacing between the 2D material and the probe, the greater the time period for which the second voltage needs to be applied between the 2D material and the probe to locally dope the 2D material.

At block 125, the first voltage between the 2D material and the substrate is removed. A portion of the 2D material proximate the probe at block 115 has a different electron density compared to a remainder of the 2D material; i.e., the 2D material is locally doped in regions that were proximate the probe at block 115. The greater the magnitude of the first voltage, the greater the amount of the local doping.

In some embodiments, the electron density in the 2D material proximate the probe is higher compared to a remainder of the 2D material; i.e., when the 2D material comprises a semiconductor or a semimetal, the 2D material has n-type local doping. In some embodiments, the electron density in the 2D material proximate the probe is lower compared to a remainder of the 2D material; i.e., when the 2D material comprises a semiconductor or a semimetal, the 2D material has p-type local doping.

Whether the electron density is higher or lower in the locally doped region of the 2D material depends on the sign of the voltage applied between the 2D material and the substrate (i.e., the first voltage, $V_{substrate}$). For example, in some embodiments, applying a positive voltage to the substrate (e.g., electrons flow to the 2D material) results in fewer electrons in the 2D material proximate the probe (e.g., when the 2D material comprises a semiconductor or a semimetal, p-type local doping of the 2D material). In some embodiments, applying a negative voltage to the substrate (e.g., electrons flow to the substrate) results in more electrons in the 2D material proximate the probe (e.g., when the 2D material comprises a semiconductor or a semimetal, n-type local doping of the 2D material).

While not wanting to be held to any theory, the mechanism of locally doping a 2D material is set forth below. The voltage between the 2D material and the substrate is referred to as $V_{substrate}$ and the voltage between the 2D material and the probe is referred to as $V_{probe}$. At block 110, when the first voltage is applied between the 2D material and the substrate ($V_{substrate}$), the 2D material is globally doped. Then, the second voltage is applied between the 2D material and the probe ($V_{probe}$) at block 115 and removed at block 120. The application of $V_{probe}$ ionizes and neutralizes defects in the second insulator either through direct injection of charge carriers or through an intense electric field. The defects that are charged and neutralized comprise point defects (e.g., atomic substitutions and lattice vacancies). The first insulator serves to prevent the charge carriers generated in the second insulator from flowing to the substrate. The change in the space charge density in the second insulator acts to screen the effect of the substrate on the 2D material.

The region of the 2D material proximate to the probe (e.g., underneath or directly underneath the probe) will return to its original doping state as if $V_{substrate}=0$ V, even when the applied $V_{substrate}$ is still nonzero. When $V_{substrate}$ is removed (i.e., set back to 0 V) at block 125, the regions of the 2D material not proximate the probe will return to their original doping state. The regions of the 2D material that were proximate the probe will be doped oppositely from the effect that the substrate had prior to the application of $V_{probe}$. This local doping persists when the probe is physically removed. The local doping can be removed or erased by applying $V_{probe}$ again with $V_{substrate}=0$ V.

Variations in the method 100 are possible. For example, in some embodiments, a third insulator is disposed on the 2D material, with the probe contacting the third insulator. The third insulator can provide a gap or spacing between the 2D material and the probe. In some embodiments, the third insulator comprises silicon oxide, hafnium oxide, aluminum oxide, boron nitride, mica, or a lithography resist. In some embodiments, the third insulator is less than about 10 nm thick, less than about 5 nm thick, or about 0.5 nm to 2 nm thick.

As another example, in some embodiments, at block 115 the probe is translated across the surface of the 2D material. This may be performed while keeping the distance between the probe and the 2D material relatively constant. When the probe comprises a metal wire or a carbon nanotube, translating the probe across the surface of the 2D material can be used to create a spatially modulated charge density in the 2D material.

Embodiments disclosed herein allow for spatial control of the charge density profile in 2D materials. By specifying the $V_{probe}$ application time to limit the diffusion of charge in the second insulator, the spatial resolution of the local doping of the 2D material be related to the cross-sectional area of the probe. If the probe is narrow on the nanometer scale (e.g., the probe conductor comprises nanowires or metallic nanotubes), the spatial modulation of the electron density can be patterned with nanometer precision. Thus, these methods may be capable of fabricating small p-n junctions and transistors.

Further, the local doping of a 2D material is reversible and can be removed or erased by subsequent applications of $V_{probe}$. For example, the $V_{probe}$ that was used to initially locally dope the 2D material can be applied again with $V_{substrate}=0$ V to remove or erase the local doping of the 2D material. The local doping method can also be used to remove or erase doping caused by light, a very large $V_{substrate}$, or other techniques.

Apparatus

Figure 2:
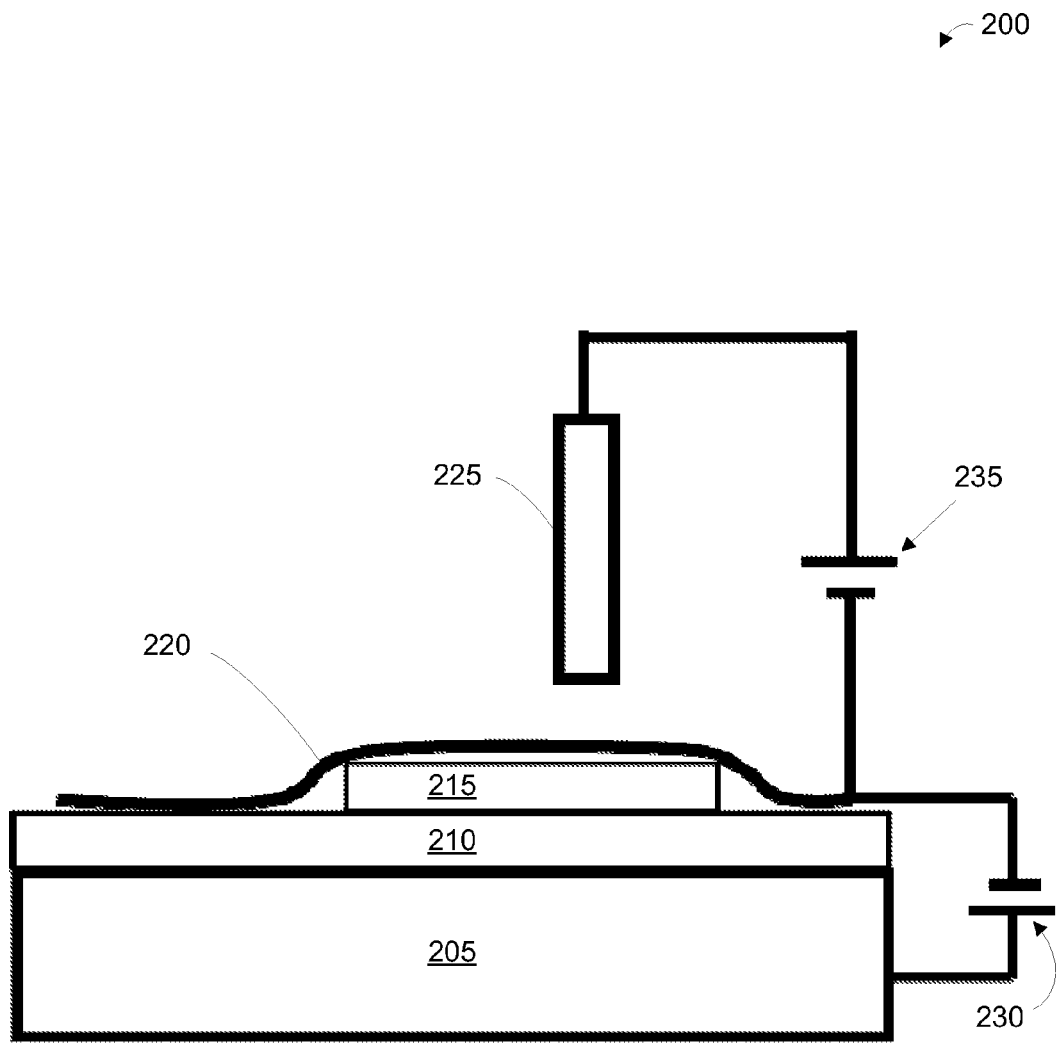
FIG. 2 shows an example of an apparatus and associated materials configured for locally doping a 2D material.

FIG. 2 shows an example of an apparatus and associated materials configured for locally doping a 2D material. As shown in FIG. 2, the apparatus and associated materials 200 includes a substrate 205, a first insulator 210 disposed on the substrate, and a second insulator 215 disposed on the first insulator. A 2D material 220 is disposed on the second insulator 215. A probe 225 can be proximate the 2D material 220. A voltage source 230 can apply a voltage between the substrate 205 and the 2D material 220. A voltage source 235 can apply a voltage between the 2D material 220 and the probe 225.

An apparatus configured for locally doping a 2D material can be custom made. Some scanning tunneling microscopes (STMs) and atomic force microscopes (AFMs) that are commercially available also may be able to locally dope a 2D material.

EXAMPLE

The following examples are intended to be examples of the embodiments disclosed herein, and are not intended to be limiting.

In experiments performed to locally dope a 2D material, graphene was used for the 2D material, hexagonal boron nitride (h-BN) was used for the second insulator, silicon oxide ($SiO_2$) for used for the first insulator, and heavily doped silicon was used for the substrate. The probe was a platinum iridium PtIr wire. While measuring the tunneling current between that probe and the 2D material, piezoelectric motors were used to position the probe relative to the 2D material. Other techniques can be used to control the distance between the probe and the 2D material, such as differential screws, for example.

Figure 3:
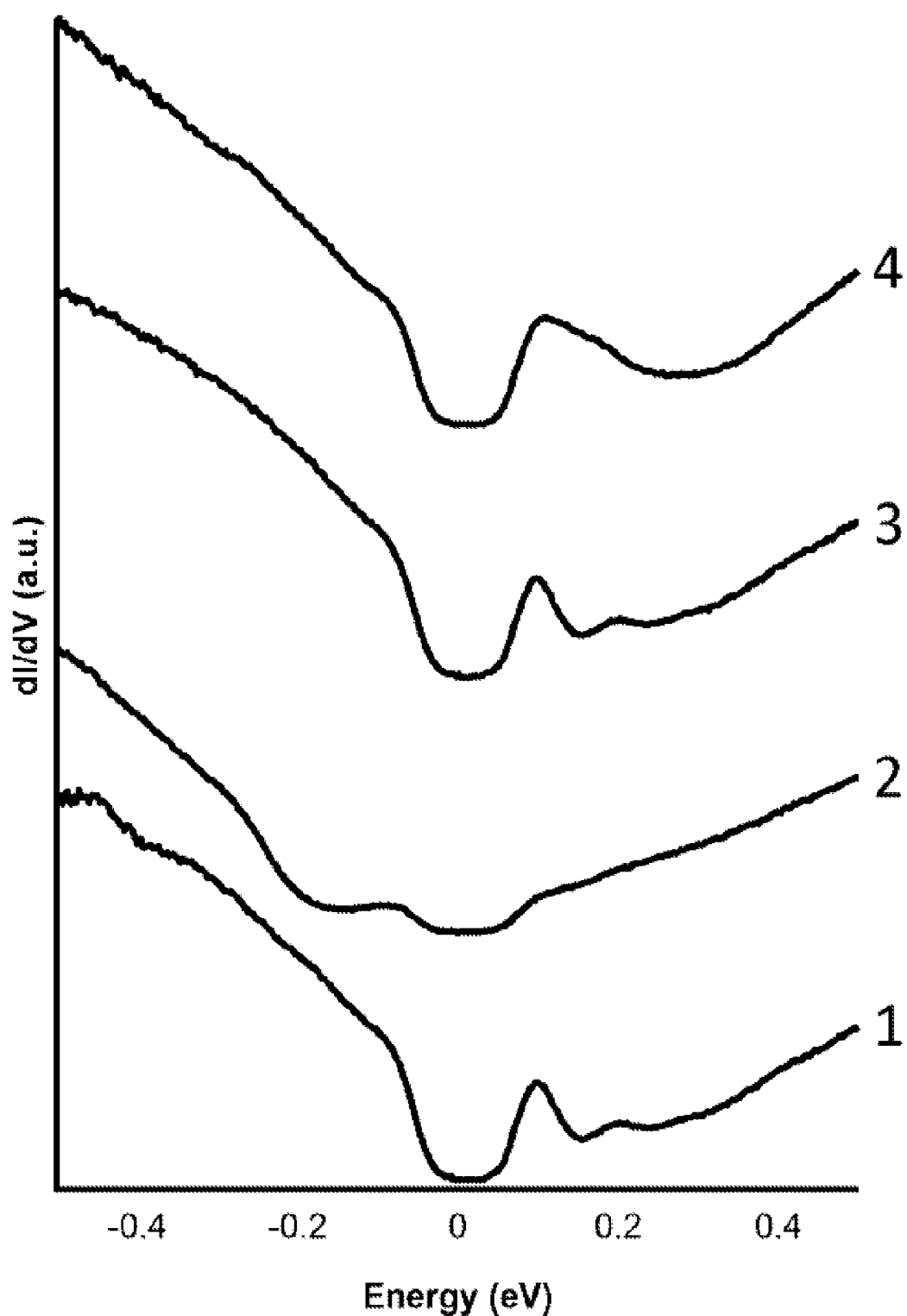
FIG. 3 shows an example of a graph of the results of local tunneling spectroscopy on locally doped graphene.

FIG. 3 shows an example of a graph of the results of local tunneling spectroscopy on locally doped graphene. The local tunneling spectroscopy was performed with the PtIr wire of the scanning tunneling microscope (STM) that was used to locally dope the graphene.

Curve 1 in FIG. 3 is the local differential conductance dI/dV measured with the voltage between the 2D material and the substrate ($V_{substrate}$) at 0 V. Curve 1 is a typical dI/dV spectrum for nearly neutral (e.g., slightly p-doped) graphene. Curve 2 is dI/dV measured after changing $V_{substrate}$ to +20 V, and indicates that the graphene is globally n-doped. The probe was then positioned 1 nm apart from graphene and a bias of −5 V was applied between the graphene and the probe ($V_{probe}$) for about 5 seconds. Curve 3 is dI/dV measured after this operation. With $V_{substrate}$ still at +20 V, curve 3 is essentially identical to curve 1 taken at $V_{substrate}$=0 V. This indicates that the $V_{probe}$ of −5 V changed the local electron density in graphene.

Transport measurements were performed to verify that the pulse-induced charge density was localized in the region of the graphene that was proximate the probe; the global charge density in the graphene remained unchanged. Curve 4 is a dI/dV spectrum with $V_{substrate}$=0 V after the locally doping the graphene. The region of graphene proximate the pulse conductor is heavily p-doped instead of nearly neutral. This local doping can be erased or reset by another application of $V_{probe}$=−5 V with $V_{substrate}$=0 V. Further measurements showed that there is no measureable decay in the local doping state over a period of 72 hours.

Applications

Embodiments of the methods described herein could be used to record and retrieve information. For example, the doping state could be used to encode bits. A device similar to a hard disk drive could be fabricated, with the 2D material replacing the disk, and the probe replacing the traditional magnetic head. With the ability to control charge on the nanometer scale, data could be stored at a much higher density than with a conventional hard disk drive. In addition, the method could also be implemented to record and retrieve information as a non-volatile memory device, similar to floating-gate field-effect transistors.

The rate at which the local doping occurs in a 2D material is sensitive to both $V_{probe}$ and the distance between the 2D material and the probe. Therefore, embodiments described herein could be used to measure small distances. If the probe is separated from the 2D material by a thin insulator with known elastic coefficients, the ability to measure small distances can be translated into the ability to measure pressures, with potential applications in touch sensors, for example.

Charge mobility of a 2D material is primarily limited by its charge inhomogeneity. Embodiments described herein could be used to tune charge mobility. For example, a preexisting charge inhomogeneity in a 2D material could be imaged then an embodiment of a method could be used neutralize the inhomogeneity. Further, embodiments described herein could be used create ordered distributions of charge, which may find application is patterning superlattice potentials.

CONCLUSION

A van der Waals heterostructure comprising a 2D material disposed on a second insulator and the second insulator disposed on a first insulator can be fabricated. In some instances, the first insulator has a larger energy gap than the second insulator. A substrate can be used to tune the global charge density on the 2D material. By application of a voltage to a conductor separated from the 2D material by less than about 10 nm, the global doping induced by the substrate is locally neutralized. The local change in charge density can remain even after the conductor, the substrate, and the first insulator are removed.

Further details regarding the embodiments described herein can be found in the publication Ju et al., "Photoinduced doping in heterostructures of graphene and boron nitride," Nature Nanotechnology 9, 348-352 (2014), which is herein incorporated by reference.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

What is claimed is:

1. A method comprising:
   (a) forming an assembly including a substrate, a first insulator disposed on the substrate, a second insulator disposed on the first insulator, and a two-dimensional (2D) material disposed on the second insulator;
   (b) applying a first voltage between the 2D material and the substrate;
   (c) with the first voltage applied between the 2D material and the substrate, applying a second voltage between the 2D material and a probe positioned proximate the 2D material;
   (d) removing the second voltage between the 2D material and the probe; and
   (e) removing the first voltage between the 2D material and the substrate, a portion of the 2D material proximate the probe in operation (c) having a different electron density compared to a remainder of the 2D material.

2. The method of claim 1, wherein the 2D material comprise about 10 monolayers of material or less.

3. The method of claim 1, wherein the 2D material comprises graphene.

4. The method of claim 1, wherein the 2D material is selected from a group consisting of molybdenum disulfide, molybdenum diselenide, tungsten disulfide, and tungsten diselenide.

5. The method of claim 1, wherein the probe is positioned about 10 nanometers or less from the 2D material in operation (c).

6. The method of claim 1, wherein the second voltage applied between the 2D material and the probe in operation (c) is about −100 volts to +100 volts.

7. The method of claim 1, wherein the second voltage applied between the 2D material and the probe in operation (c) is about +5 volts or higher.

8. The method of claim 1, wherein the second voltage applied between the 2D material and the probe in operation (c) is about −3 volts or lower.

9. The method of claim 1, wherein the second voltage applied between the 2D material and the probe in operation (c) is applied for about 0.1 seconds to 5 minutes.

10. The method of claim 1, wherein the first voltage applied between the 2D material and the substrate in operation (b) is about −150 volts to about +150 volts.

11. The method of claim 1, wherein the first insulator comprises a material selected from a group consisting of silicon oxide, hafnium oxide, and aluminum oxide, wherein the second insulator comprises a material selected from a group consisting of boron nitride and a silicate mineral, and wherein the substrate comprises a material selected from a group consisting of a doped semiconductor, a layered semimetal, and a metal.

12. The method of claim 1, wherein the first insulator has a greater band gap than the second insulator.

13. The method of claim 1, wherein the probe comprises a conductive material.

14. The method of claim 1, wherein the probe comprises a metal wire or a carbon nanotube.

15. The method of claim 1, wherein the probe comprises a conductive substrate and a pattern disposed on a surface the conductive substrate comprising a conductive material.

16. The method of claim 1, wherein the first insulator is about 10 nanometers to 500 nanometers thick.

17. The method of claim 1, wherein the second insulator is about 5 nanometers to 300 nanometers thick.

18. The method of claim 1, wherein the substrate has a thickness of about 50 nanometers or greater.

* * * * *